United States Patent [19]
Lee

[11] Patent Number: 6,130,124
[45] Date of Patent: Oct. 10, 2000

[54] METHODS OF FORMING CAPACITOR ELECTRODES HAVING REDUCED SUSCEPTIBILITY TO OXIDATION

[75] Inventor: Byoung-tack Lee, Seoul, Rep. of Korea

[73] Assignee: Samsung Electronics Co., Ltd., Rep. of Korea

[21] Appl. No.: 08/969,803

[22] Filed: Nov. 13, 1997

[30] Foreign Application Priority Data

Dec. 4, 1996 [KR] Rep. of Korea ............... 96-61658
Jul. 16, 1997 [KR] Rep. of Korea ............... 97-33246

[51] Int. Cl.[7] .................................. H01L 21/8242
[52] U.S. Cl. ................................ 438/240; 438/254
[58] Field of Search ................... 438/3, 238, 239–240, 438/253, 254, 396, 397

[56] References Cited

U.S. PATENT DOCUMENTS

| | | | |
|---|---|---|---|
| 4,348,263 | 9/1982 | Draper et al. | 204/29 |
| 4,466,177 | 8/1984 | Chao | 29/571 |
| 5,019,535 | 5/1991 | Wojnarowski et al. | 437/209 |
| 5,066,615 | 11/1991 | Brady et al. | 437/229 |
| 5,074,969 | 12/1991 | Brewer et al. | 205/118 |
| 5,122,477 | 6/1992 | Wolters et al. | 437/60 |
| 5,173,170 | 12/1992 | Brown et al. | 205/96 |
| 5,281,549 | 1/1994 | Fazan et al. | 437/52 |
| 5,335,138 | 8/1994 | Sandhu et al. | 361/303 |
| 5,366,920 | 11/1994 | Yamamichi et al. | 437/52 |
| 5,372,974 | 12/1994 | Doan et al. | 437/240 |
| 5,392,189 | 2/1995 | Fazan et al. | 361/305 |
| 5,409,862 | 4/1995 | Wada et al. | 437/197 |
| 5,464,786 | 11/1995 | Figura et al. | 437/52 |
| 5,478,772 | 12/1995 | Fazan | 437/60 |
| 5,504,041 | 4/1996 | Summerfelt | 437/235 |
| 5,506,166 | 4/1996 | Sandhu et al. | 437/60 |
| 5,563,762 | 10/1996 | Leung et al. | 361/301 |
| 5,618,746 | 4/1997 | Hwang | 438/3 |
| 5,629,236 | 5/1997 | Wada et al. | 438/607 |
| 5,686,760 | 11/1997 | Miyakawa | 257/751 |
| 5,696,015 | 12/1997 | Hwang | 437/52 |
| 5,877,062 | 3/1999 | Horii | 438/396 |
| 5,918,118 | 6/1999 | Kim et al. | 438/238 |

FOREIGN PATENT DOCUMENTS

| | | |
|---|---|---|
| 0 697 717 | 2/1996 | European Pat. Off. . |
| 97-13305 | 3/1997 | Rep. of Korea . |
| WO96/17381 | 6/1996 | WIPO . |

OTHER PUBLICATIONS

European Search Report, EP 97 30 6270, Nov. 2, 1998.
Itoh et al., "Integration of BST Thin Film for DRAM Fabrication", Integrated Ferroelectrics, vol. 11, 1995, pp. 101–109.
Notice to Submit Response, Korean Application No. 10–1997–0059413, Oct. 29, 1999.

Primary Examiner—Joni Chang
Attorney, Agent, or Firm—Myers Bigel Sibley & Sajovec

[57] ABSTRACT

Methods of forming capacitors in memory devices include the steps of forming a first electrically insulating layer having a first conductive contact plug therein, on a semiconductor substrate, and then forming a first diffusion barrier pattern in electrical contact with the first conductive contact plug. A second electrically insulating layer having a contact hole therein is then formed on an upper surface of the first diffusion barrier pattern, to inhibit parasitic oxidation of the first diffusion barrier pattern. A lower electrode of a capacitor is then formed on the second electrically insulating layer. The lower electrode is electrically coupled to the first diffusion barrier pattern and may contact the first diffusion barrier pattern directly or may be coupled through a second diffusion barrier pattern to the first diffusion barrier pattern. A dielectric layer and upper electrode are then formed on the lower electrode. The step of forming the first electrode may comprise patterning a conductive layer to extend on an upper surface of second electrically insulating layer and into the contact hole so that the first electrode has a relatively greater cross-sectional thickness in the contact hole to inhibit migration of oxidation to the first diffusion barrier pattern. The step of forming a first electrode may also be preceded by the step of forming a second diffusion barrier pattern in the contact hole. The second diffusion barrier pattern also preferably inhibits migration of oxidation to the first diffusion barrier pattern during processing.

16 Claims, 7 Drawing Sheets

METHODS OF FORMING CAPACITOR ELECTRODES HAVING REDUCED SUSCEPTIBILITY TO OXIDATION

CROSS-REFERENCE TO RELATED APPLICATIONS

This application is related to application Ser. No. 08/969,672, entitled METHODS OF FORMING INTEGRATED CIRCUIT CAPACITORS USING METAL REFLOW TECHNIQUES and application Ser. No. 08/969,395, entitled METHODS OF FORMING INTEGRATED CIRCUIT CAPACITORS HAVING PROTECTED DIFFUSION BARRIER METAL LAYERS THEREIN, filed concurrently herewith, the disclosures of which are hereby incorporated herein by reference.

FIELD OF THE INVENTION

The present invention relates to methods of forming integrated circuit devices, and more particularly to methods of forming integrated circuit devices having capacitors therein.

BACKGROUND OF THE INVENTION

The decrease in cell capacitance which typically occurs when the area of a memory cell is decreased poses a serious obstacle to the continued increase in integration levels of DRAMs. The decrease in cell capacitance impedes the operation of devices at low voltages, lowers the reading ability of a memory cell and increases soft error rate.

The amount of charge Q which can be stored in a capacitor is equal to a product of the capacitor capacitance C and the voltage V applied across the capacitor. That is, $Q=C \times V$. Thus, to obtain a predetermined amount of charge at decreased operation voltages, the capacitance should be increased. Assuming that the effective area of a capacitor is A, a dielectric constant in vacuum is $\epsilon_0$, the relative dielectric constant of the dielectric $\epsilon_r$, and the thickness of the dielectric is d, the capacitance C is equal to $A\epsilon_0\epsilon_r/d$. Therefore, the capacitor capacitance C increases with increases in effective area A, a larger relative dielectric constant $\epsilon_r$, and a smaller thickness d of the dielectric layer.

To increase the effective area of a capacitor, three-dimensional lower electrode structures have been suggested. However, it is typically difficult to apply these three-dimensional lower electrode structures in real situations since their manufacturing processes are complicated and defects are likely to occur during the manufacturing processes.

Accordingly, research has been actively conducted on making a thin film of a material of a high dielectric constant to be used as a capacitor dielectric. A capacitor having a thin film of high dielectric constant is more preferred in terms of high integration level as well as process simplification because a capacitor comprises a high dielectric constant material can have a sufficient capacitance with a simple two-dimensional lower electrode structure.

However, when a lower electrode is formed of impurity-doped polysilicon as in the prior art, materials having high dielectric constants may react with polysilicon and cause the formation of a dielectric layer having a very low dielectric constant at the interface with the lower electrode. Therefore, there is an increasing need for new structures of a lower electrode which are suitable for capacitors to which a thin film of a high dielectric constant is applied.

FIGS. 1, 2, and 3 are sectional views for explaining a conventional method for manufacturing a capacitor of a semiconductor device. FIG. 1 illustrates the step of forming an interlayer insulating layer pattern 20 and a contact plug 30. The interlayer insulating layer pattern 20 is formed on a semiconductor substrate 10 to have a contact hole exposing a predetermined area of the semiconductor substrate 10. Subsequently, an impurity-doped polysilicon layer is formed on the resultant structure having the interlayer insulating layer pattern 20, to fill the contact hole. Then, the contact plug 30 is formed in the contact hole by completing etching the polysilicon layer till the interlayer insulating layer pattern 20 is exposed.

FIG. 2 illustrates the step of completing a lower electrode comprising the contact plug 30, a diffusion barrier layer pattern 40, and a conductive layer pattern 50 by forming the diffusion barrier layer 40 and the conductive layer pattern 50. First, a diffusion barrier layer and a conductive layer are sequentially formed of a titanium nitride (TiN) and platinum (Pt), respectively, on the resultant structure having the contact plug 30 formed therein.

Then, the diffusion barrier layer pattern 40 and the conductive layer pattern 50 are formed to be sequentially stacked on the contact plug 30 by sequentially etching the conductive layer and the diffusion barrier layer till the interlayer insulating layer pattern 20 is exposed. Thus, the lower electrode comprises the contact plug 30, the diffusion barrier layer pattern 40, and the conductive layer pattern 50. The diffusion barrier layer pattern 40 serves to prevent the capacitance of the capacitor to be formed from decreasing in response to a reaction between the contact plug 30 and the conductive layer pattern 50 in a subsequent dielectric forming process.

FIG. 3 illustrates the step of completing the capacitor by forming a dielectric layer 60 and an upper electrode 70. First, an amorphous dielectric layer containing Ba, Sr, Ti, and O is formed on the structure having the lower electrode formed thereon by chemical vapor deposition (CVD) or sputtering. Then, the structure including the amorphous dielectric layer is heat-treated at 500–750° C. so that the amorphous dielectric layer is crystallized. Thus, a crystalline dielectric layer 60 is formed of (Ba, Sr)TiO$_2$ of a perovskite structure. The crystalline dielectric layer 60 is referred to as the dielectric layer 60, hereinafter.

Alternatively, the dielectric layer 60 can be formed in an in-situ method where materials respectively containing Ba, Sr, Ti, and O are deposited on the structure including the lower electrode, while the structure including the lower electrode is being heat-treated at 500–750° C. Then, the upper electrode 70 is formed on the dielectric layer 60, thus completing the capacitor. Thus, the dielectric forming step is typically accompanied by the above-described heat treatment. Since a sidewall A of the diffusion barrier layer pattern 40 makes contact with the amorphous dielectric layer containing oxygen, oxygen penetrates into the sidewall A of the diffusion barrier layer pattern 40 during the heat treatment step and causes oxidation of the diffusion barrier layer pattern 40 and the contact plug 30 which results in the formation of materials having a low dielectric constants such as TiO$_2$ and SiO$_2$. In addition, when the dielectric layer 60 is formed in-situ, the diffusion barrier layer pattern 40 and the contact plug 30 are also oxidized because the sidewall of the diffusion barrier layer pattern 40 is exposed to an oxygen atmosphere. The diffusion barrier layer pattern 40 and the contact plug 30 may also be oxidized by oxygen penetrating through the conductive layer pattern 50 and into the diffusion barrier layer pattern 40.

Consequently, according to conventional methods for manufacturing a capacitor for a semiconductor device, though the diffusion barrier layer pattern 40 prevents the contact plug 30 and the conductive layer pattern 50 from reacting at their interface, oxygen penetrating into the sidewall of the diffusion barrier layer pattern 40 and the conductive layer pattern 50 during the step of forming the dielectric layer 60 may oxidize the diffusion barrier layer pattern 40 and the contact plug 30, thus producing materials of low dielectric constants such as $TiO_2$ and $SiO_2$. As a result, the capacitance of the capacitor may be reduced.

SUMMARY OF THE INVENTION

It is therefore an object of the present invention to provide improved methods of forming capacitors for memory devices and capacitors formed thereby.

It is another object of the present invention to provide methods of forming capacitors having high capacitance and capacitors formed thereby.

It is still another object of the present invention to provide methods of forming capacitors which reduced susceptibility to electrode oxidation and capacitors formed thereby.

These and other objects, advantages and features of the present invention are provided by methods of forming capacitors which include the steps of forming a first electrically insulating layer having a first conductive contact plug therein, on a semiconductor substrate, and then forming a first diffusion barrier pattern in electrical contact with the first conductive contact plug. A second electrically insulating layer having a contact hole therein is then formed on an upper surface of the first diffusion barrier pattern, to inhibit parasitic oxidation of the first diffusion barrier pattern. A lower electrode of a capacitor is then formed on the second electrically insulating layer. The lower electrode is electrically coupled to the first diffusion barrier pattern and may contact the first diffusion barrier pattern directly or may be coupled through a second diffusion barrier pattern to the first diffusion barrier pattern. A dielectric layer is then formed on the lower electrode. The dielectric layer may comprise a recrystallized amorphous dielectric layer. An upper electrode of the capacitor is then formed on the dielectric layer, opposite the lower electrode.

According to one embodiment of the present invention, the step of forming a first electrode of the capacitor comprises patterning a conductive layer to extend on an upper surface of the second electrically insulating layer and into the contact hole. Thus, the first electrode has a relatively greater cross-sectional thickness in the contact hole to inhibit migration of oxidation from the dielectric layer to the first diffusion barrier pattern. The step of forming a first diffusion barrier pattern also preferably precedes said step of forming a second insulating layer. According to a second embodiment of the present invention, the step of forming a first electrode of the capacitor is preceded by the step of forming a second diffusion barrier pattern in the contact hole. The second diffusion barrier pattern also preferably inhibits migration of oxidation to the first diffusion barrier pattern during processing. According to preferred aspects of the present invention, the first diffusion barrier pattern comprises a material selected from the group consisting of Ta, Co, TiN, (Ti, Al)N, (Ti,Si)N, TaN, (Ta, Si)N, TiSix, TaSix and CoSix and the second diffusion barrier pattern comprises a material selected from the group consisting of Ir, Ru, $IrO_2$ and $RuO_2$. The step of forming the dielectric layer may also comprise the step of forming a dielectric layer comprising a material selected from the group consisting of $SrTiO_3$, $(Ba, Sr)TiO_3$, $(PB, Zr)TiO_3$ and $(Pb, Zr)(Ti, La)TiO_3$.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types. Like numbers refer to like elements throughout.

Figure 1:
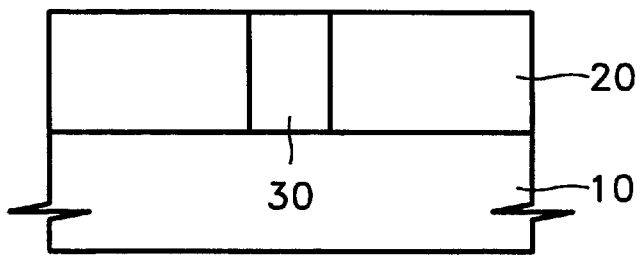
FIGS. 1–3 are cross-sectional views of intermediate structures that illustrate a method of forming a capacitor according to the prior art.
Figure 2:
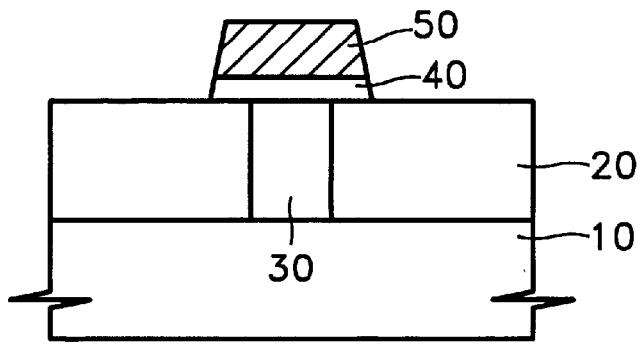
Figure 3:
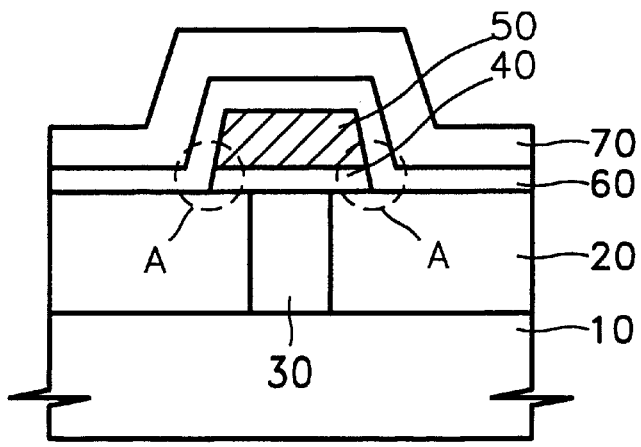
Figure 4:
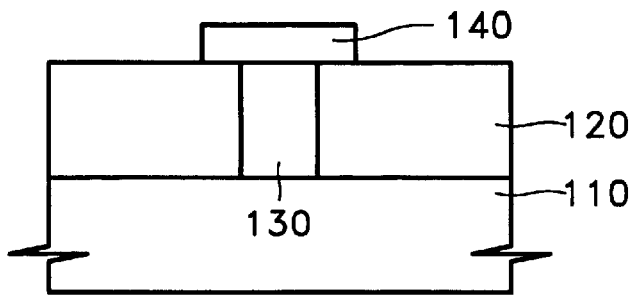
FIGS. 4–6 are cross-sectional views of intermediate structures that illustrate a method of forming a capacitor according to a first embodiment of the present invention.

FIG. 4 illustrates the step of forming a first interlayer insulating layer pattern 120, a contact plug 130, and a diffusion barrier layer pattern 140. The first interlayer insulating layer pattern 120 is formed on a semiconductor substrate 110 to have a first contact hole therein which exposes a predetermined area of the semiconductor substrate 110. Then, a first conductive layer is formed on the first interlayer insulating layer pattern 120, to fill the first contact hole. The first conductive layer may be formed of impurity-doped polysilicon, tungsten (W), tungsten nitride (WN), or tungsten silicide (WSix). Subsequently, the contact plug 130 is formed in the first contact hole by etching the first conductive layer until the first interlayer insulating layer pattern 120 is exposed.

A diffusion barrier layer is then formed of Ta, Co, TiN, (Ti, Al)N, (Ti, Si)N, TaN, (Ta, Si)N, TiSix, TaSix, or CoSix on the insulating layer pattern 120 and the contact plug 130. Here, the diffusion barrier layer serves to prevent reaction between the contact plug 130 and a conductive layer pattern 150 of FIG. 5. Then, the diffusion barrier layer pattern 140 is formed on the contact plug 130 by selectively etching the diffusion barrier layer until the first interlayer insulating layer pattern 120 is exposed.

Figure 5:
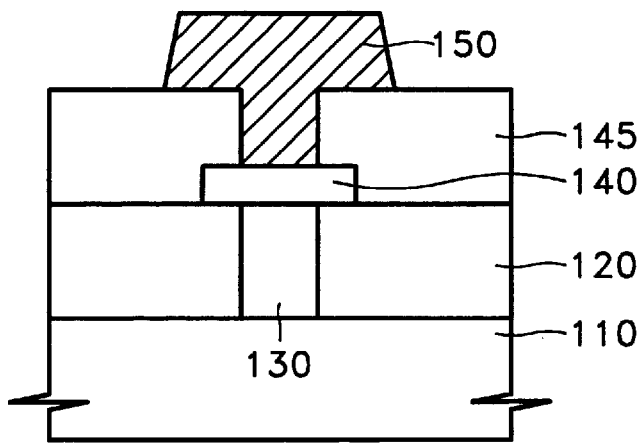

FIG. 5 illustrates the step of forming a second interlayer insulating layer pattern 145 and a conductive layer pattern 150, thus completing a lower electrode having the contact plug 130, the diffusion barrier layer pattern 140, and the conductive layer pattern 150. First, a second interlayer insulating layer is formed on the diffusion barrier layer pattern 140, as illustrated. Then, the second interlayer insulating layer pattern 145 is formed to have a second contact hole by selectively etching the second interlayer insulating layer until the diffusion barrier layer pattern 140 is exposed. A second conductive layer is then formed of platinum (Pt), iridium (Ir), ruthenium(Ru), iridium dioxide (IrO$_2$), or ruthenium dioxide (RuO$_2$). Then, the conductive layer pattern 150 is formed on the second interlayer insulating layer pattern 145 to make contact with the diffusion barrier layer pattern 140 through the second contact hole, by selectively etching the second conductive layer until the second interlayer insulating layer pattern 145 is exposed.

Figure 6:
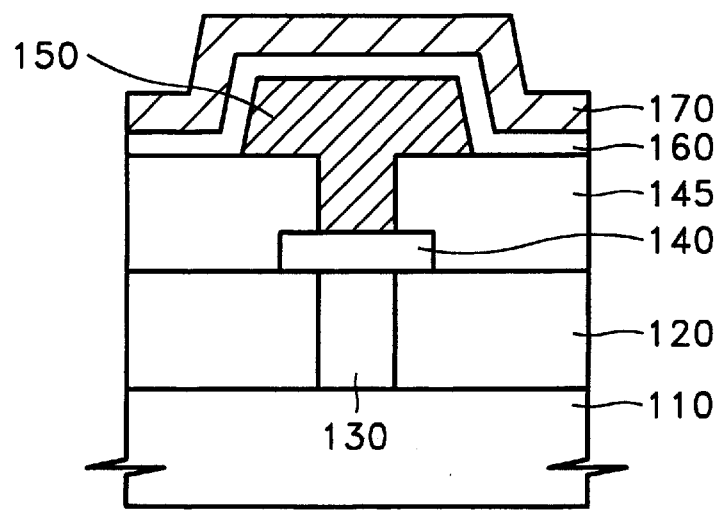

FIG. 6 illustrates the step of completing the capacitor of the present invention by forming a dielectric layer 160 and an upper electrode 170. First, an amorphous dielectric layer is formed on the completed lower electrode. Then, the amorphous dielectric layer is heat-treated to crystallize the amorphous dielectric layer, thus forming a crystalline dielectric layer 160 of SrTiO$_3$, (BaSr)TiO$_3$, (Pb, Zr)TiO$_3$, or (Pb, Zr)(Ti, La)TiO$_3$. Alternately, the crystalline dielectric layer 160 may be formed in-situ, while the lower electrode is heat-treated. The crystalline dielectric layer 160 is referred to as the dielectric layer 160, hereinafter. Then, the upper electrode 170 of the capacitor is formed on the dielectric layer 160, thus completing the capacitor of the present invention.

Here, since the diffusion barrier layer pattern 140 does not contact the amorphous dielectric layer, oxygen cannot react with the diffusion barrier layer pattern 140 during the heat treatment step. Therefore, oxidation of the diffusion barrier layer pattern 140 and the contact plug 130 is prevented. When the dielectric layer 160 is formed in-situ, oxidation of the diffusion barrier layer pattern 142 and the contact plug 130 can be also prevented because the diffusion barrier layer pattern 142 is not exposed to an oxygen atmosphere. Moreover, even if the second interlayer insulating layer 145 is thin, it takes a larger amount time for oxygen to reach the diffusion barrier layer pattern 140 through the conductive layer pattern 150 because the conductive layer pattern 150 contacts the diffusion barrier layer pattern 140 through the second contact hole (i.e., the effective thickness of the conductive layer pattern 150 is increased). Accordingly, oxidation of the diffusion barrier layer pattern 140 due to oxygen introduced through the conductive layer pattern 150 can also be prevented.

Figure 7:
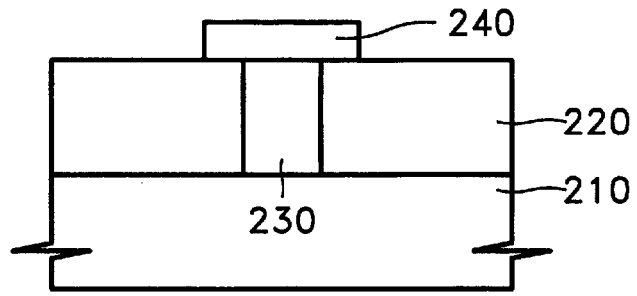
FIGS. 7–9 are cross-sectional views of intermediate structures that illustrate a method of forming a capacitor according to a second embodiment of the present invention.
Figure 8:
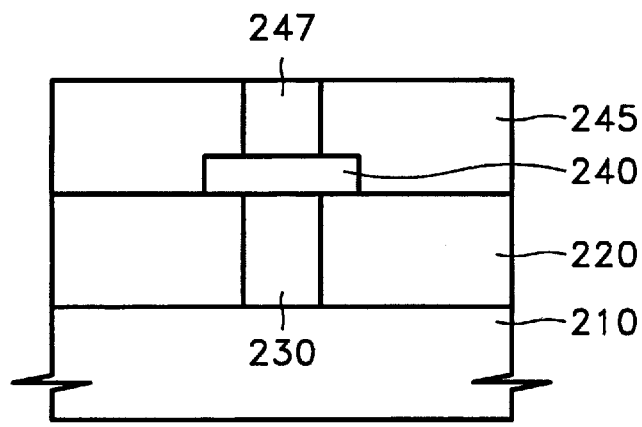
Figure 9:
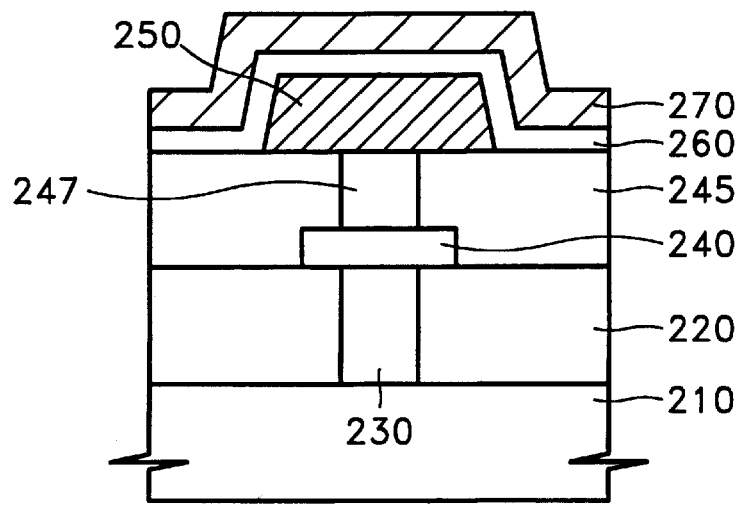

FIGS. 7, 8, and 9 are sectional views for explaining a method for manufacturing a capacitor for a semiconductor device according to a second embodiment of the present invention. FIG. 7 illustrates the step of forming a first interlayer insulating layer pattern 220, a contact plug 230, and a first diffusion barrier layer pattern 240. The first interlayer insulating layer pattern 220 is formed on a semiconductor substrate 210 to have a first contact hole exposing a predetermined area of the semiconductor substrate 210. Then, a first conductive layer is formed of impurity-dope polysilicon, tungsten (W), tungsten nitride (WN), or tungsten silicide (Wsix) to fill the first contact hole, on the first interlayer insulating layer pattern 220. Subsequently, the contact plug 230 is formed in the first contact hole by completely etching the first conductive layer until the first interlayer insulating layer pattern 220 is exposed.

A first diffusion barrier layer is formed of Ta, Co, TiN, (Ti, Al)N, (Ti, Si)N, TaN, (Ta, Si)N, TiSix, TaSix, or CoSix on the first interlayer insulating layer pattern 220 and the contact plug 230. Here, the first diffusion barrier layer serves to prevent reaction between the contact plug 230 and a second diffusion barrier layer pattern 247 of FIG. 8. Then, the first diffusion barrier layer pattern 240 is formed on the contact plug 230 by selectively etching the first diffusion barrier layer until the interlayer insulating layer pattern 220 is exposed.

FIG. 8 illustrates the step of forming a second interlayer insulating layer 245 and a second diffusion barrier layer pattern 247. Here, a second interlayer insulating layer is formed on the first diffusion barrier layer pattern 240 and interlayer insulating layer pattern 220. Then, the second interlayer insulating layer pattern 245 is formed to have a second contact hole by patterning the second interlayer insulating layer until the first diffusion barrier layer pattern 240 is exposed. Then, a diffusion barrier layer is formed of iridium (Ir), ruthenium (Ru), iridium dioxide(IrO$_2$), or ruthenium dioxide (RuO$_2$)to fill the second contact hole, on the second interlayer insulating layer pattern 245. Here, the second diffusion barrier layer can be formed to have a double-layer structure where iridium and iridium dioxide are sequentially stacked to increase the adhesiveness between the second diffusion barrier layer and a conductive layer pattern 250 of FIG. 9. Then, the second diffusion barrier layer pattern 247 is formed in the second contact hole by completely etching the second diffusion barrier layer until the second interlayer insulating layer pattern 245 is exposed. Here, the second diffusion barrier layer pattern 247 serves to prevent oxidation of the first diffusion barrier layer pattern 240.

FIG. 9 illustrates the steps of completing a lower electrode including the contact plug 230, the first diffusion barrier layer pattern 240, the second diffusion barrier layer pattern 247, and the conductive layer pattern 250, and completing the capacitor of the present invention by forming a dielectric layer 260 and an upper electrode 270. Here, a second conductive layer is formed on the second diffusion barrier layer pattern 247, using platinum (Pt). Then, the conductive layer pattern 250 is formed on the second diffusion barrier layer pattern 247 by patterning the second conductive layer until the second interlayer insulating layer pattern 245 is exposed. Thus, the lower electrode having the contact plug 230, the first diffusion barrier layer pattern 240, the second diffusion barrier layer pattern 247, and the conductive layer pattern 250 is completed.

Subsequently, an amorphous dielectric layer is formed on the completed lower electrode. Then, the amorphous dielectric layer is heat-treated to crystallize the amorphous dielectric layer, thus forming a crystalline dielectric layer 260 of SrTiO$_3$, (BaSr)TiO$_3$, (Pb, Zr)TiO$_3$, or (Pb, Zr)(Ti, La)TiO$_3$. Alternatively, the crystalline dielectric layer 160 may be formed in-situ, while the lower electrode is heat-treated. The crystalline dielectric layer 260 is referred to as the dielectric layer 260, hereinafter. Then, the upper electrode 270 is formed on the dielectric layer 260, thus completing the capacitor of the present invention.

Here, since the first diffusion barrier layer pattern 240 makes no contact with the amorphous dielectric layer, oxidation of the first diffusion barrier layer pattern 240 is prevented during the heat-treatment step to crystallize the amorphous dielectric layer. When the dielectric layer 260 is formed in-situ, oxidation of the first diffusion barrier layer pattern 240 is prevented because the first diffusion barrier layer pattern 240 is not exposed to an oxygen atmosphere. Furthermore, reaction between oxygen introduced through the conductive layer pattern 250 and the first diffusion barrier layer pattern 240 can be prevented by forming the second diffusion barrier layer pattern 247. As described above, according to the method for manufacturing a capacitor for a semiconductor device according to the present invention, reduction of the capacitance of the capacitor due to oxidation of a portion of the lower electrode can be prevented by limiting oxidation of the diffusion barrier layer pattern 140 or the first diffusion barrier layer pattern 240.

Figure 10:
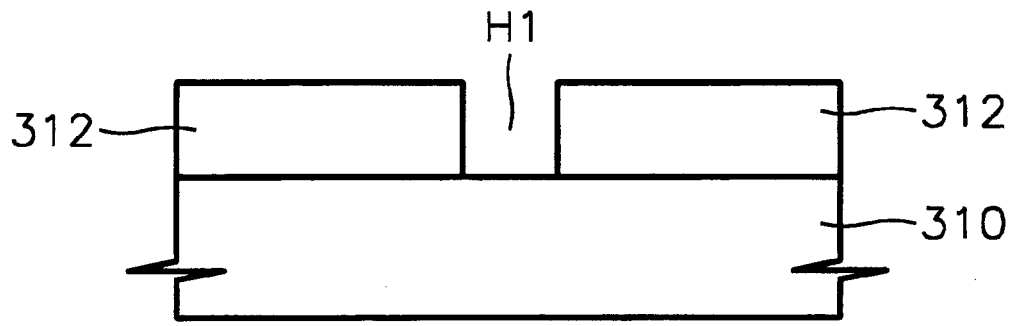
FIGS. 10–17 are cross-sectional views of intermediate structures that illustrate a method of forming a capacitor according to a third embodiment of the present invention.

Referring now to FIGS. 10–17, a third embodiment of the present invention will be described. In particular, as illustrated by FIG. 10, a first interlayer dielectric film is formed on a semiconductor substrate 310 in which an underlying structure such as a memory cell transistor (not shown) is formed, in order to insulate the underlying structure. A photoresist pattern (not shown) exposing some of the first interlayer dielectric film is formed on the first interlayer dielectric film using a photolithography process. Then, a first interlayer dielectric film pattern 312 which includes a columnar first contact hole H1 exposing a source/drain region (not shown) of the transistor, is formed by dry etching the exposed first interlayer dielectric film using the photoresist pattern as an etching mask.

Figure 11:
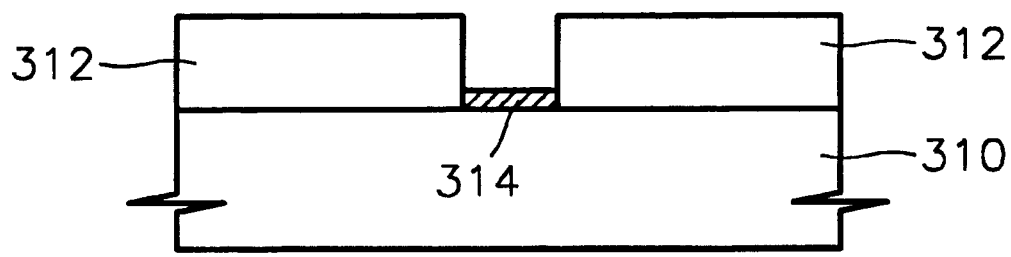

Referring to FIG. 11, an ohmic contact layer 314 is formed on the surface of the semiconductor substrate 310 exposed through the first contact hole H1, using metal silicide such as TiSi and CoSi. The ohmic contact layer 314 is preferably formed to provide an ohmic contact between the silicon of the semiconductor substrate 310 and a barrier layer material which will fill the first contact hole H1 in the following process.

Figure 12:
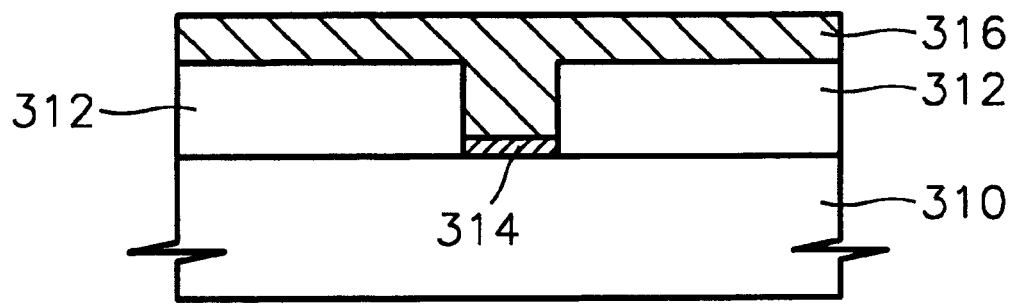

Referring to FIG. 12, a barrier material layer 316 such as a TiN layer is formed on the upper portion of the first interlayer dielectric film pattern 312, to a thickness enough to fill the first contact hole H1. In addition to the above-mentioned TiN, any suitable material which can prevent diffusion between silicon in the semiconductor substrate 310 and a subsequently formed lower electrode (such as Pt) can be used for forming the barrier material layer 316. Examples of barrier materials are TiAlN, TaSiN, TaAlN, TiSiN, TaSi, TiSi, Ta, TaN, CoSi, and Co.

Figure 13:
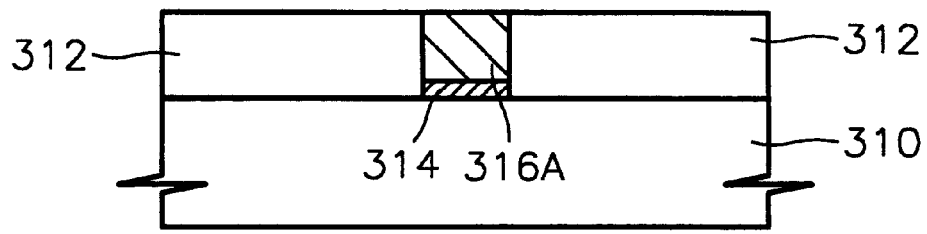

Referring to FIG. 13, a contact plug 316A formed of the barrier material, is formed in the first contact hole H1, by removing the barrier material layer 316 from the upper portion of the first interlayer dielectric film pattern 312 but not from the inside of the first contact hole H1, using a dry etching process or a chemical mechanical polishing (CMP) process. As a result, the contact plug 316A represents a columnar barrier layer whose side surface is not exposed and whose upper surface is flat in a horizontal direction. The contact plug 316A formed of the barrier material forms a part of the contact between the lower electrode of the capacitor and the source/drain region (not shown) of the transistor.

Figure 14:
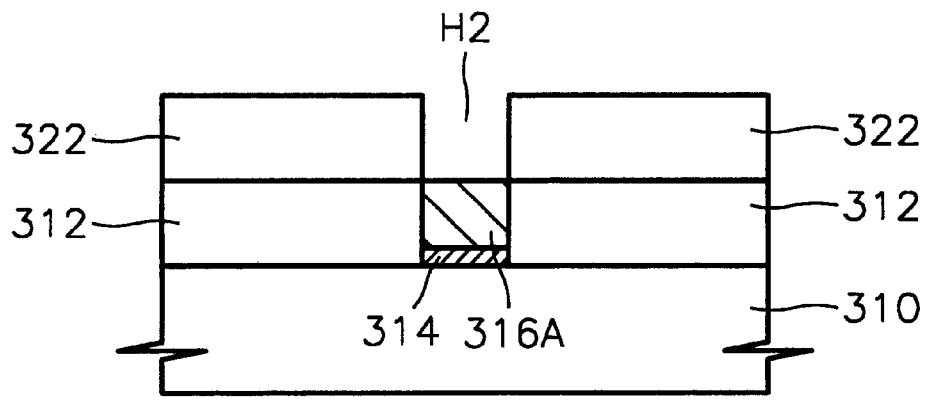

Referring to FIG. 14, a second interlayer dielectric film pattern 322 is formed by forming a second interlayer dielectric film on the first interlayer dielectric film pattern and then patterning the second interlayer dielectric film using a photolithography process. The second interlayer dielectric film pattern 322 includes a second contact hole H2 exposing the upper surface of the contact plug 316A.

Figure 15:
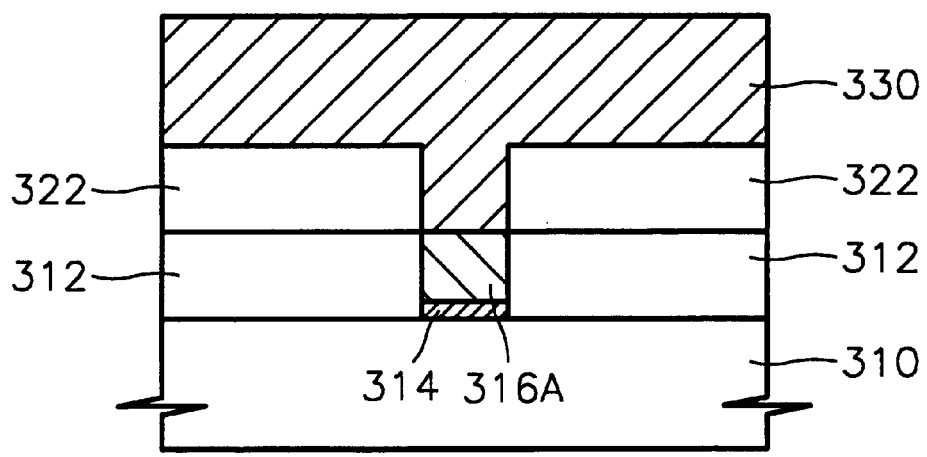

Referring to FIG. 15, a conductive material layer 330 (such as a Pt layer) for forming the lower electrode, is formed on the second interlayer dielectric film pattern 322. The conductive material layer 330 can be formed using Ir, $IrO_2$, Ru, $RuO_2$, or other oxide conductors other than the above-mentioned Pt. The conductive material layer 130 is formed using physical vapor deposition (PVD) or chemical vapor deposition (CVD). It is possible to form the conductive material layer 330 by depositing a conductive material such as Pt on the entire surface of the second interlayer dielectric film pattern 322 and reflowing the conductive material.

Figure 16:
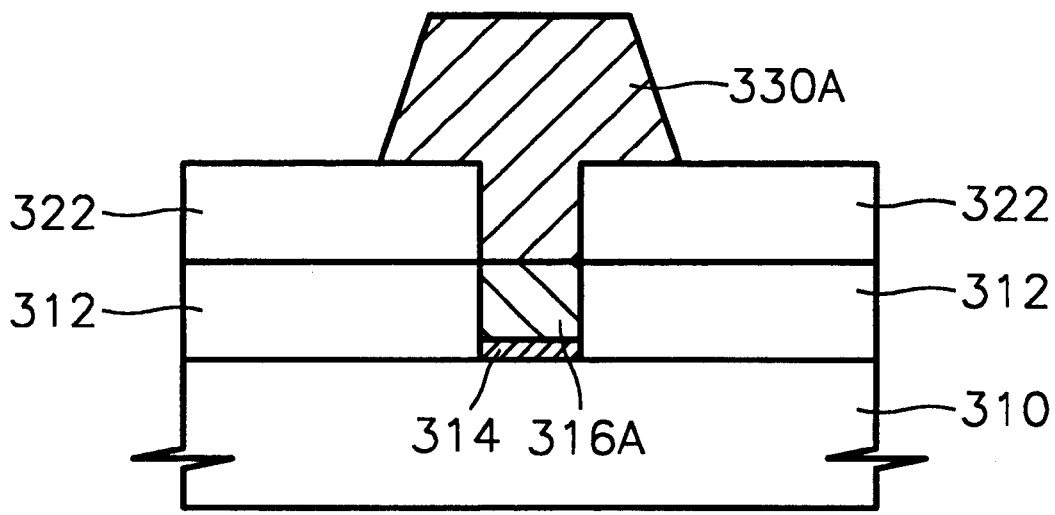

Referring to FIG. 16, a lower electrode 330A is formed, contacting the first contact plug 316A through the second contact hole H2. The part of the lower electrode 330A formed in the second contact hole H2 forms the remaining part of the contact between the lower electrode of the capacitor and the source/drain region of a transistor.

Figure 17:
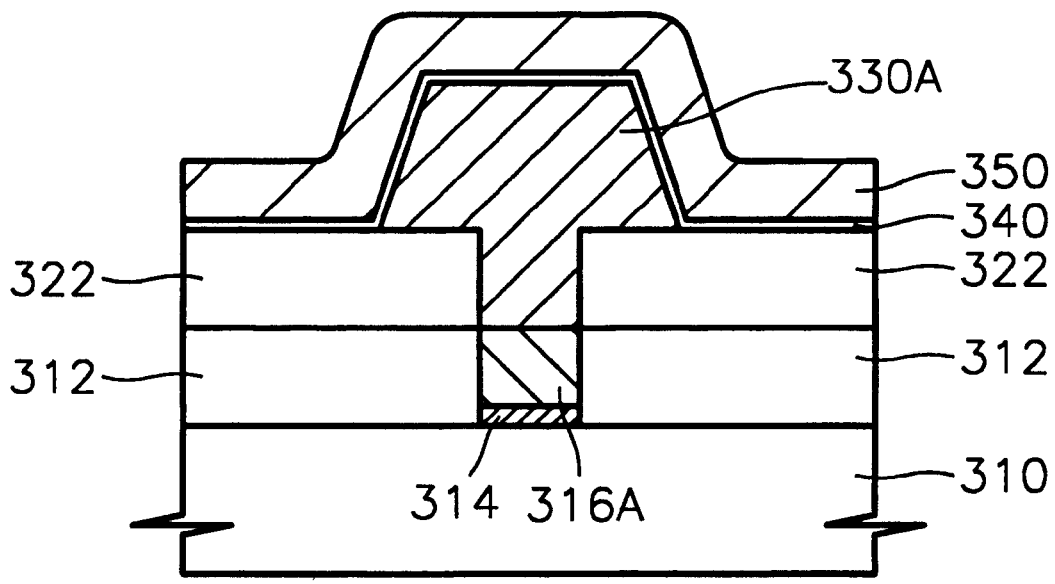

Referring to FIG. 17, a dielectric film 340 is formed on the structure resulting after forming the lower electrode 330A. The dielectric film 340 is preferably formed of STO ($SrTiO_3$), BST, PZT or PLZT. Then, the capacitor according to the third embodiment of the present invention is completed by forming an upper electrode 350 formed of Pt on the dielectric film 340.

As mentioned above, according to the third embodiment of the present invention, it is possible to prevent the oxidization of the barrier layer since the passage of oxygen to the surfaces of the barrier layer is impeded. The path of oxygen diffusing through the upper electrode to reach the upper surface of the barrier layer is much longer than in the conventional capacitor. The path of oxygen to the side surfaces of the barrier layer is completely blocked, since these surfaces are in contact with an interlayer dielectric film.

Figure 18:
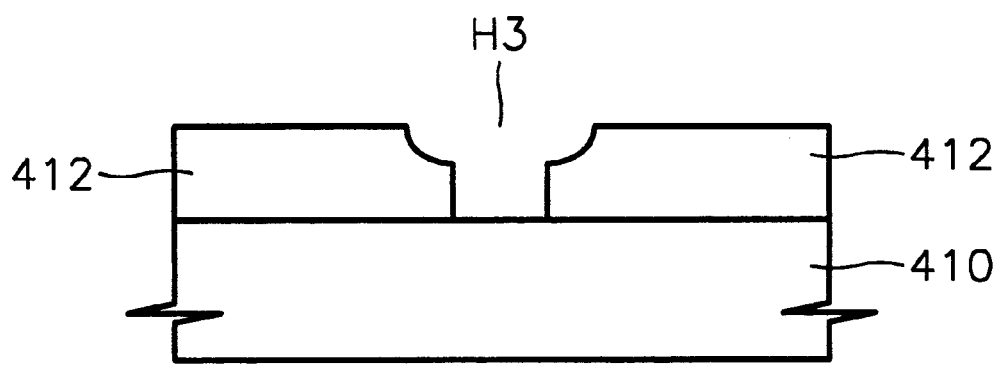
FIGS. 18–19 are cross-sectional views of intermediate structures that illustrate a method of forming a capacitor according to a fourth embodiment of the present invention.
Figure 19:
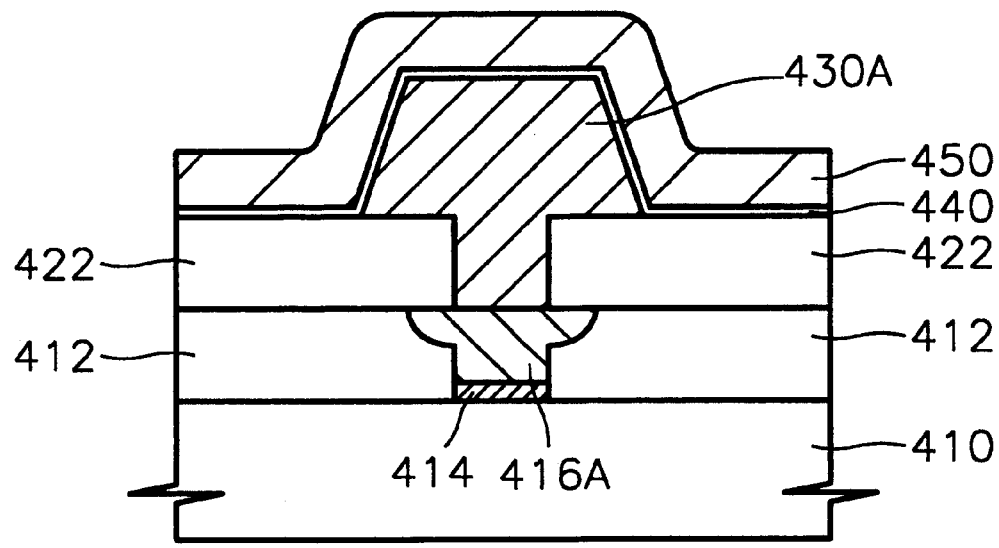

FIGS. 18 and 19 are used to describe a method for manufacturing a capacitor of a semiconductor memory device according to a fourth embodiment of the present invention. Referring to FIG. 18, a first interlayer dielectric film is formed on a semiconductor substrate 410 by the above-mentioned method with reference to FIG. 10 in the third embodiment. A photoresist pattern (not shown), exposing some of the first interlayer dielectric film, is also formed on the first interlayer dielectric film using a photolithography process. Then, a first interlayer dielectric film pattern 412 is formed to include a columnar contact hole H3 therein whose entrance on the upper side is wide as shown in FIG. 18. This shape is achieved by partially wet etching the exposed first interlayer dielectric film to a predetermined depth, using the photoresist pattern as an etching mask, and then dry etching the exposed first interlayer dielectric film, using the photoresist pattern as an etching mask. Then, the photoresist pattern is removed.

Referring to FIG. 19, an ohmic contact layer 414 formed of metal silicide and a contact plug 416A formed of a barrier material, are formed in the contact hole H3 by the above-mentioned method with reference to FIGS. 11, 12, and 13 in the third embodiment. As a result, a barrier, having a T-shaped cross-section, is formed by the contact plug 416A, whose side surfaces are not exposed and upper surface is flat and horizontal. Then, the capacitor according to the fourth embodiment of the present invention is completed by forming a second interlayer dielectric film pattern 422, a lower electrode 430A, a dielectric film 440, and an upper electrode 450, by the above-mentioned method with reference to FIGS. 14–17 in the third embodiment.

As mentioned above, according to the fourth embodiment of the present invention, it is possible to prevent oxidization of the barrier layer since the passage of oxygen to the side surfaces of the barrier layer is impeded. The path of oxygen diffusing through the upper electrode to reach the upper surface of the barrier layer is much longer than in the conventional capacitor. The path of oxygen to the side surfaces of the barrier layer is completely blocked, since these surfaces are in contact with an interlayer dielectric film. Also, it is possible to reduce misalignment between the contact plug which forms the barrier layer and the second contact hole in which the lower electrode is formed, since the cross section of the barrier layer when seen from the side has a T shape, which increases the alignment margin.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a capacitor, comprising the steps of:

forming a first electrically insulating layer having a first conductive contact plug therein, on a semiconductor substrate;

forming a first diffusion barrier pattern in electrical contact with the first conductive contact plug;

forming a second electrically insulating layer having a contact hole therein, on an upper surface of the first diffusion barrier pattern;

forming a first electrode of the capacitor on the second electrically insulating layer, electrically coupled to the first diffusion barrier pattern;

forming a dielectric layer on the first electrode; and forming a second electrode of the capacitor on the dielectric layer, opposite the first electrode;

wherein said step of forming a first diffusion barrier pattern comprises forming a first diffusion barrier pattern on an upper surface of the first electrically insulating layer.

2. The method of claim 1, wherein said step of forming a first electrode of the capacitor comprises patterning a conductive layer to extend on an upper surface of second electrically insulating layer and into the contact hole.

3. The method of claim 2, wherein said step of forming a first diffusion barrier pattern precedes said step of forming a second insulating layer.

4. The method of claim 1, wherein the conductive contact plug has an upper surface that is coplanar with the upper surface of the first electrically insulating layer.

5. A method of forming a capacitor, comprising the steps of:

forming a first electrically insulating layer having a first conductive contact plug therein, on a semiconductor substrate;

forming a first diffusion barrier pattern in electrical contact with the first conductive contact plug;

forming a second electrically insulating layer having a contact hole therein, on an upper surface of the first diffusion barrier pattern;

forming a first electrode of the capacitor on the second electrically insulating layer, electrically coupled to the first diffusion barrier pattern;

forming a dielectric layer on the first electrode; and forming a second electrode of the capacitor on the dielectric layer, opposite the first electrode;

wherein said step of forming a first electrode of the capacitor is preceded by the step of forming a second diffusion barrier pattern in the contact hole; wherein said step of forming a second diffusion barrier pattern in the contact hole follows said step of forming a second electrically insulating layer; and wherein said step of forming a first electrode of the capacitor comprises forming a first electrode of the capacitor on an upper surface of the second electrically insulating layer and in electrical contact with an upper surface of the second diffusion barrier pattern.

6. The method of claim 5, wherein the first conductive contact plug, first diffusion barrier pattern and first electrode are formed of doped polysilicon, titanium nitride and platinum, respectively.

7. A method of forming a capacitor, comprising the steps of:

forming a first electrically insulating layer having a first conductive contact plug therein, on a semiconductor substrate;

forming a first diffusion barrier pattern in electrical contact with the first conductive contact plug;

forming a second electrically insulating layer having a contact hole therein, on an upper surface of the first diffusion barrier pattern;

forming a first electrode of the capacitor on the second electrically insulating layer, electrically coupled to the first diffusion barrier pattern;

forming a dielectric layer on the first electrode; and forming a second electrode of the capacitor on the dielectric layer, opposite the first electrode;

wherein said step of forming a first electrode of the capacitor is preceded by the step of forming a second diffusion barrier pattern in the contact hole;

wherein said step of forming a first electrode of the capacitor comprises forming a first electrode of the capacitor on an upper surface of the second electrically insulating layer and in electrical contact with an upper surface of the second diffusion barrier pattern; and wherein the first diffusion barrier pattern comprises a material selected from the group consisting of Ta, Co, TiN, (Ti, Al)N, (Ti,Si)N, TaN, (Ta, Si)N, TiSix, TaSix and CoSix; and wherein the second diffusion barrier pattern comprises a material selected from the group consisting of Ir, Ru, IrO$_2$ and RuO$_2$.

8. The method of claim 7, wherein said step of forming a dielectric layer comprises forming a dielectric layer comprising a material selected from the group consisting of SrTiO$_3$, (Ba, Sr)TiO$_3$, (PB, Zr)TiO$_3$ and (Pb, Zr)(Ti, La)TiO$_3$.

9. A method of forming a capacitor, comprising the steps of:

forming a first electrically insulating layer having a first conductive contact plug therein, on a semiconductor substrate;

forming a first diffusion barrier pattern in electrical contact with the first conductive contact plug;

forming a second electrically insulating layer having a contact hole therein, on an upper surface of the first diffusion barrier pattern;

forming a first electrode of the capacitor on the second electrically insulating layer, electrically coupled to the first diffusion barrier pattern;

forming a dielectric layer on the first electrode; and forming a second electrode of the capacitor on the dielectric layer, opposite the first electrode;

wherein said step of forming a first electrode of the capacitor is preceded by the step of forming a second diffusion barrier pattern in the contact hole;

wherein said step of forming a first electrode of the capacitor comprises forming a first electrode of the capacitor on an upper surface of the second electrically insulating layer and in electrical contact with an upper surface of the second diffusion barrier pattern; and wherein the second diffusion barrier pattern comprises a material selected from the group consisting of Ir, Ru, IrO$_2$ and RuO$_2$.

10. A method of forming a capacitor, comprising the steps of:
   forming a first electrically insulating layer on a face of a semiconductor substrate;
   forming a first contact hole in the first electrically insulating layer; then
   forming a first conductive layer comprising a material selected from the group consisting of doped polysilicon, tungsten and tungsten nitride, on an upper surface of the first electrically insulating layer and in the first contact hole;
   removing the first conductive layer to expose the upper surface of the first electrically insulating layer and define a first contact plug in the first contact hole, said first contact plug having an upper surface that is coplanar with the upper surface of the first electrically insulating layer;
   forming a second conductive layer comprising a material selected from the group consisting of Ta, Co, TiN, (Ti, Al)N, (Ti,Si)N, TaN, (Ta, Si)N, TiSix, TaSix and CoSix, on the upper surface of the first electrically insulating layer and on an upper surface of the first contact plug;
   patterning the second conductive layer to define a first diffusion barrier pattern in electrical contact with the first conductive contact plug; then
   forming a second electrically insulating layer having a second contact hole therein that exposes the first diffusion barrier pattern;
   forming a first electrode of the capacitor on the second electrically insulating layer, electrically coupled to the first diffusion barrier pattern;
   forming a dielectric layer on the first electrode; and
   forming a second electrode of the capacitor on the dielectric layer, opposite the first electrode.

11. The method of claim 10, wherein said step of forming a first electrode of the capacitor is preceded by the step of forming a second diffusion barrier pattern as a second contact plug in the second contact hole; and wherein said step of forming a first electrode of the capacitor comprises forming a first electrode of the capacitor on an upper surface of the second electrically insulating layer and in electrical contact with an upper surface of the second contact plug.

12. The method of claim 11, wherein the second contact plug comprises a material selected from the group consisting of Ir, Ru, $IrO_2$ and $RuO_2$.

13. The method of claim 12, wherein said step of forming a dielectric layer comprises forming a dielectric layer comprising a material selected from the group consisting of $SrTiO_3$, $(Ba, Sr)TiO_3$, $(PB, Zr)TiO_3$ and $(Pb, Zr)(Ti, La)TiO_3$.

14. A method of forming a capacitor, comprising the steps of:
   forming a first electrically insulating layer having a first contact hole therein, on a semiconductor substrate, by depositing an electrically insulating layer on the semiconductor substrate and sequentially wet etching and then dry etching the deposited electrically insulating layer, using an etching mask, so that the first contact hole has an outwardly tapered sidewall;
   forming a first diffusion barrier plug in the first contact hole;
   forming a second electrically insulating layer having a second contact hole therein exposing the first diffusion barrier plug, on the first electrically insulating layer;
   forming a first electrode of the capacitor on the second electrically insulating layer and in the second contact hole;
   forming a dielectric layer on the first electrode; and
   forming a second electrode of the capacitor on the dielectric layer, opposite the first electrode.

15. The method of claim 14, wherein said step of forming a first diffusion barrier plug is preceded by the step of forming an ohmic contact region comprising a metal silicide in the first contact hole.

16. The method of claim 15, wherein the first diffusion barrier plug comprises a material selected from the group consisting of Ta, Co, TiN, TiAlN, TiSiN, TaN, TaSiN, TiSix, TaSix and CoSix.

* * * * *